United States Patent
Stoisiek et al.

(10) Patent No.: US 6,191,456 B1
(45) Date of Patent: Feb. 20, 2001

(54) LATERAL IGBT IN AN SOI CONFIGURATION AND METHOD FOR ITS FABRICATION

(75) Inventors: Michael Stoisiek; Dirk Vietzke, both of München (DE)

(73) Assignee: Siemens Aktiengesellschaft, Munich (DE)

(*) Notice: Under 35 U.S.C. 154(b), the term of this patent shall be extended for 0 days.

(21) Appl. No.: 09/344,927

(22) Filed: Jun. 28, 1999

(30) Foreign Application Priority Data

Jun. 26, 1998 (DE) .............................................. 198 28 669

(51) Int. Cl.$^7$ .............................. H01L 29/76; H01L 33/00
(52) U.S. Cl. .......................... 257/368; 257/355; 257/409
(58) Field of Search ................................... 257/368, 355, 257/409

(56) References Cited

U.S. PATENT DOCUMENTS

| 4,937,647 | * | 6/1990 | Sutton . |
| 5,200,638 | * | 4/1993 | Kida et al. . |
| 5,321,295 | * | 6/1994 | Hisamoto . |
| 5,920,087 | * | 7/1999 | Nakagawa et al. . |

FOREIGN PATENT DOCUMENTS 0338 312 A2   10/1989   (EP) .

OTHER PUBLICATIONS

M. Stoisiek et al.: Dielectric Isolated High–Voltage IC–Technology for Off–Line Applications, Proceedings of 1995 International Symposium on Power Semiconductor Devices and ICs, Yokohama, pp. 325–329.

Zuxin Qin: "A Novel Multi–Channel Approach to Improve LIGBT Performance", 1997 IEEE, pp. 313–316.

* cited by examiner

Primary Examiner—Stephen D. Meier
(74) Attorney, Agent, or Firm—Herbert L. Lerner; Laurence A. Greenberg; Werner H. Stemer

(57) ABSTRACT

A lateral IGBT in an SOI configuration having a top side and an underside is proposed. The lateral IGBT has a drain zone extending to the top side and is of a first conductivity type. The underside of the LIGBT forms a substrate of a second conductivity type. A lateral insulation layer is situated between the substrate and the drain zone. At least one laterally formed region of the second conductivity type is situated in the drain zone, in the vicinity of the lateral insulation layer. These laterally formed regions being spaced apart from one another lying in one plane.

16 Claims, 3 Drawing Sheets

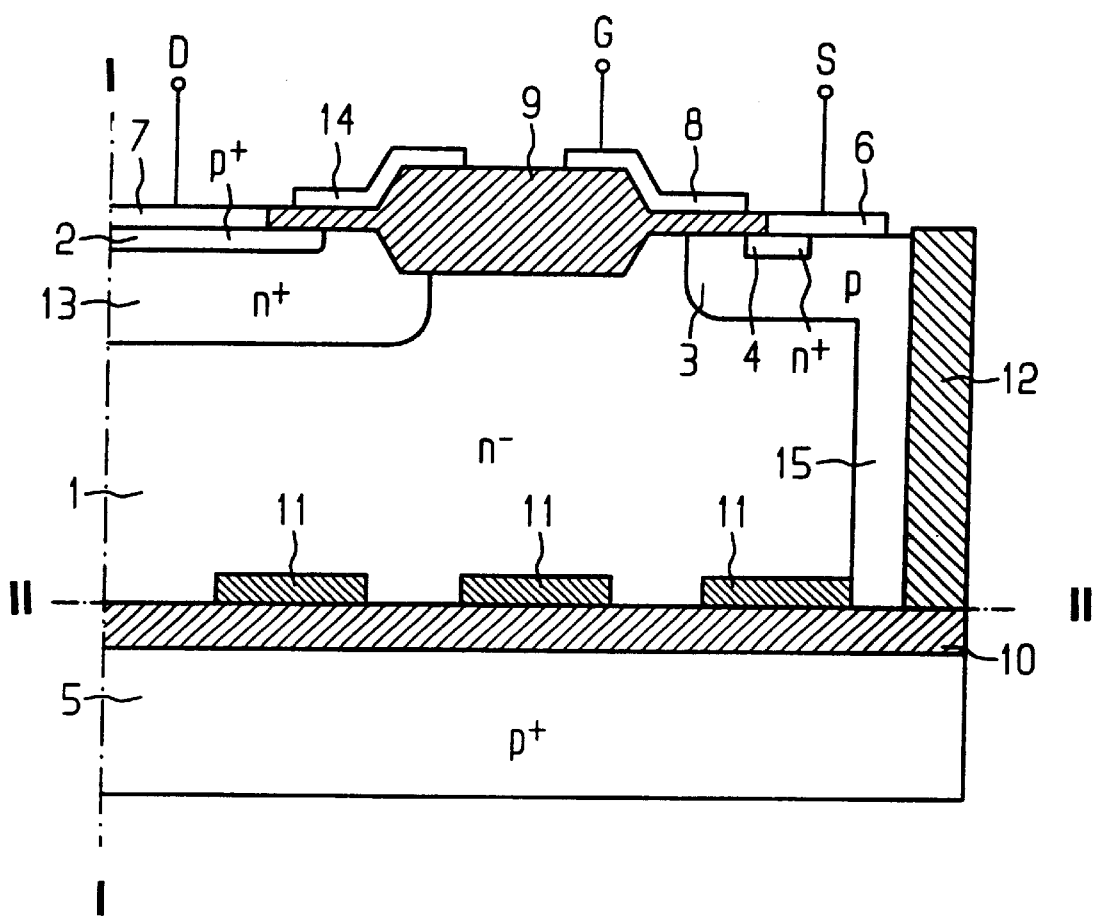

LATERAL IGBT IN AN SOI CONFIGURATION AND METHOD FOR ITS FABRICATION

BACKGROUND OF THE INVENTION

Field of the Invention

The invention relates to a lateral insulated gate bipolar transistor (LIGBT) in a silicon on insulator (SOI) configuration having a top side and an underside, and a drain zone of a first conductivity type extending to the top side. An anode zone of a second conductivity type is incorporated in the drain zone and the anode zone extends to the top side. Furthermore, a base zone of the second conductivity type is incorporated in the drain zone, the base zone extending to the top side and there being incorporated in the base zone a source zone of the first conductivity type, which source zone extends to the top side. The underside of the lateral IGBT forms a substrate of the second conductivity type. A lateral insulation layer is provided between the drain zone and the substrate.

Circuit configurations having power semiconductor switches are used in the automotive sector, in the telecommunications sector, in the consumer sector and also for the purpose of load control and many other applications. The LIGBT is one of the components used most in circuit configurations of this type. A high blocking voltage can be obtained with LIGBTs, on account of the long drift zone, but the current-carrying capacity is unsatisfactory in comparison with a vertical IGBT.

In order to be able to ensure a required reverse voltage for a predetermined thickness of the drain zone, suitable doping of the drain zone is performed. In this case, the blocking voltage is taken up not only by the drain zone but also, to a significant proportion, by the insulation layer situated underneath.

SUMMARY OF THE INVENTION

It is accordingly an object of the invention to provide a lateral IGBT in an SOI configuration and a method for its fabrication which overcome the above-mentioned disadvantages of the prior art methods and devices of this general type, which has lower turn-off losses in comparison with the prior art without simultaneously decreasing the reverse voltage in the process.

With the foregoing and other objects in view there is provided, in accordance with the invention, a lateral IGBT in an SOI configuration having a top side and an underside. The lateral IGBT has a drain zone of a first conductivity type, which drain zone extends to the top side. An anode zone of a second conductivity type is incorporated in the drain zone and the anode zone runs to the top side. Furthermore, a base zone of the second conductivity type is incorporated in the drain zone and the base zone extends to the top side. There being incorporated in the base zone a source zone of the first conductivity type, which source zone extends to the top side. The underside of the LIGBT forms a substrate of the second conductivity type. The LIGBT has a source electrode that is in contact with the source zone and the base zone. Furthermore, it contains a drain electrode that is in contact with the anode zone. A gate insulating layer disposed on the top side is situated between the source zone and the anode zone. A gate electrode is disposed on the gate insulating layer. A lateral insulation layer is provided between the drain zone and the substrate.

The invention is based on the concept that at least one laterally formed region of the second conductivity type is provided in the drain zone, in the vicinity of the insulation layer. In this case, the laterally formed region has a smaller area than the lateral insulation layer that is provided.

This configuration has the advantage that the terrace-shaped profile of the voltage rise during the turn-off of the LIGBT is shifted toward a lower voltage value and, at the same time, the terrace phase is shortened in the process. This results in a smaller power loss. At the same time, however, the maximum reverse voltage is maintained.

The reason why the turn-off losses can be reduced without the maximum reverse voltage being simultaneously decreased in the process is that the laterally formed regions of the second conductivity type provided in the vicinity of the lateral insulation layer are formed in the source-drain direction and, at the same time, have interruptions and, consequently, do not areally cover the entire lateral insulation layer. At least partial regions of the drain zone are thus in contact with the lateral insulation layer. These interruptions enable the electric field to penetrate the insulation oxide in the event of the IGBT being subjected to reverse voltage loading. The penetration of the electric field into the insulation oxide is of relevance, primarily in respect to the reverse voltage endurance. On the other hand, the laterally formed regions of the second conductivity type enable the stored charge to be depleted more rapidly during the switching-off operation of the LIGBT and, consequently, the switch-off losses to be reduced.

In one development, the LIGBT has a vertical and insulating boundary in the form of a trench, which boundary extends from the top side to as far as the lateral insulating layer. The vertical insulation region (in the form of a trench) enables the LIGBT to be integrated with any other semiconductor components (e.g. logic elements) on a semiconductor substrate.

In a further refinement of the LIGBT, the anode zone lies in a drain extension of the first conductivity type and the drain extension adjoins the top side. The drain extension has a higher doping than the drain zone and serves to keep the space charge zone away from the anode zone during the switching-off operation of the LIGBT.

In one development, the LIGBT has a field plate covering the drain extension on the gate insulating layer. Favorable influencing of the electric field within the LIGBT is obtained as a result of this.

In a further refinement, the LIGBT has a vertically running region of the second conductivity type, which region abuts the insulation region in the form of a trench. In this case, the vertically running region of the second conductivity type is connected to the base zone. The latter serves to control the inversion layer on the underside of the LIGBT. If the LIGBT is in the blocking state, the transition between the vertically running region of the second conductivity type and the drain zone of the first conductivity type is controlled in the reverse direction and, in this way, prevents the formation of an inversion layer between the drain zone and the lateral insulation layer.

Furthermore, in an advantageous refinement, the LIGBT is characterized in that the substrate is at a fixed potential. The latter may be a fixed voltage or, in an advantageous manner, ground. However, it is also conceivable for the potential to float. In this case, the substrate can take up a higher reverse voltage. The insulation region in the form of a trench should be at the lowest potential of the component. It is preferable for the insulation region in the form of a trench to be connected to the ground potential.

In a further refinement, the LIGBT is constructed mirror-symmetrically in a lateral orientation. In this case, the anode zone and the drain electrode situated thereon lie in the center of the semiconductor component. The insulation regions in trench form in this case form the lateral outer boundary of the LIGBT. It is advantageous if the LIGBT has a finger-shaped form, since a utilization that is particularly efficient in respect of area can thereby be obtained in the event of a plurality of LIGBTs being connected in parallel on a semiconductor substrate.

In a further refinement, the lateral regions provided in the drain zone have a polygonal form and are spaced apart from one another regularly lying in one plane. In this case, the lateral regions of the second conductivity type may have any desired form, provided that it is ensured that two lateral regions lying next to one another are respectively spaced apart from one another by a certain distance. It is advantageous if the configuration is effected in a regular sequence. The lateral regions may in this case have a square, rectangular, octagonal or else round form.

In another refinement, the lateral regions provided in the drain zone have a form that is adapted to the circumference of the LIGBT, and are spaced apart from one another identically lying in one plane. If the LIGBT has e.g. a finger-shaped border, then lateral regions provided in the drain zone are likewise finger-shaped. The lateral region of the second conductivity type which lies nearest the vertical insulation region in the form of a trench has the largest circumference, while the lateral region of the second conductivity type which lies nearest the axis of symmetry has the smallest circumference. In this configuration, too, it must again be ensured that the lateral regions are at a certain distance from one another, so that the electric field can penetrate the lateral insulation layer. It is advantageous for the spacing of the individual lateral regions with respect to one another to be regularly disposed.

The LIGBT according to the invention can be fabricated particularly easily if the lateral regions of the second conductivity type which are provided in the drain zone adjoin the lateral insulation layer. This is not absolutely necessary, however.

It is likewise conceivable, in one refinement of the LIGBT according to the invention, for the lateral regions lying nearest the edge in the drain zone to be in contact with the insulation region in the form of a trench.

The lateral form of the LIGBT may be round or finger-shaped. The finger-shaped form is advantageous on account of effective utilization of area in the event of a plurality of IGBTs being connected in parallel. However, the IGBT is not restricted to these lateral forms. Other forms are also conceivable.

It is advantageous for both the lateral insulation layer and the insulation region in the form of a trench to be fabricated from $SiO_2$, since, in this case, known fabrication methods can be used and particularly simple fabrication is possible.

It has turned out that it is particularly advantageous for the charge carrier density of the lateral regions provided in the drain zone to be configured between one times $10^{17}$ and one times $10^{19}$.

The fabrication of the LIGBT according to the invention can be carried out in a simple manner by the following steps, without the fabrication steps having to be greatly modified relative to a conventional lateral IGBT. It becomes evident from the following fabrication steps that the invention is fabricated in a wafer-bonded process.

In the first step, at least one laterally formed region of the second conductivity type is produced in that side of the drain zone that subsequently faces the substrate. If only one lateral region is provided, then it must be configured to be smaller than the subsequent dielectric well. If a plurality of lateral regions are provided, then they are spaced apart from one another. In this case, the lateral regions provided in the drain zone may have e.g. a polygonal form or a form adapted to the form of the lateral IGBT and are advantageously spaced apart from one another regularly lying in one plane. In this case, the lateral regions that are provided can be fabricated not only by diffusion but also by photoresist-masked implantation. The use of boron is expedient.

It is more advantageous to select a polygonal form for the lateral regions that are provided in the drain zone, and to space them apart from one another regularly, since this fabrication step can be carried out independently of the subsequent emplacement of the IGBT structure produced on the opposite side of the drain zone. If the lateral regions have a form adapted to the form of the LIGBT, it must be ensured that they are aligned with the drain zone, the anode zone and also the base and source zones in such a way that the lateral regions of the second conductivity type are disposed mirror-symmetrically in the finished LIGBT. In the case where the bottom doping of the lateral regions in the drain zone has a polygonal form and the size of the individual doped polygons is considerably smaller than the lateral extent of the component, the dielectric wells with the components situated on the top side need not, by contrast, be aligned with the pattern of the doped lateral regions.

In a second step, the lateral insulation layer is applied to a semiconductor wafer of the second conductivity type, which semiconductor wafer forms the substrate. It is advantageous to apply the lateral insulation layer to the semiconductor wafer forming the substrate since, on account of the differently doped surface regions of the drain zone, an oxide layer of varying thickness would be produced and would make it more difficult to apply the substrate to the lateral insulation layer. After the side of the drain zone which forms the subsequent top side of the LIGBT with the electrode has been thinned back, the composite of the lateral insulation layer and the substrate is connected to the side opposite to the top side of the drain zone. The anode zone, the base zone and also the source zone are subsequently produced in a known manner on that side of the drain zone which is remote from the lateral insulation layer. The further steps correspond to the fabrication of a conventional lateral IGBT, e.g. the production of an insulation region in the form of a trench and also the provision of the necessary electrodes and/or field plates.

Other features which are considered as characteristic for the invention are set forth in the appended claims.

Although the invention is illustrated and described herein as embodied in a lateral IGBT in an SOI configuration and a method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a sectional view of the lateral IGBT according to the invention; and

DESCRIPTION OF THE PREFERRED EMBODIMENTS

Figure 1:
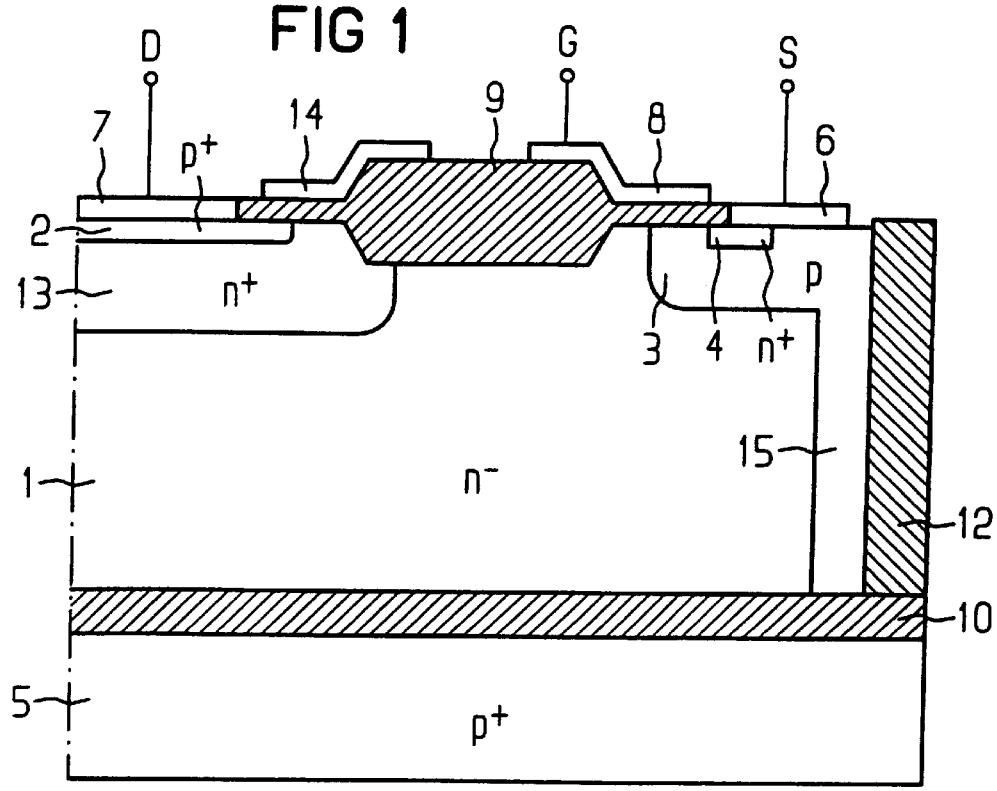
FIG. 1 is a diagrammatic, sectional view of a lateral IGBT in accordance with the prior art.

In all the figures of the drawing, sub-features and integral parts that correspond to one another bear the same reference symbol in each case. Referring now to the figures of the drawing in detail and first, particularly, to FIG. 1 thereof, there is shown a structure of an LIGBT according to the prior art. A configuration of this type is described for example in Proceedings of 1995 International Symposium on Power Semiconductor Devices & ICs, Yokohama, Pages 325–329.

FIG. 1 shows the lateral IGBT in an SOI configuration with a top side and an underside, a weakly n-doped drain zone 1 extending to the top side. A drain extension 13 extending to the top side is incorporated in the drain zone 1, the drain extension being heavily n-doped. A p-doped anode zone 2 lies in the drain extension 13 and likewise extends to the top side. Furthermore, a base zone 3, which extends to the top side and is likewise p-doped, is incorporated in the drain zone 1, in which base zone 3, for its part, an n-type source zone 4 extending to the top side is incorporated. The underside of the semiconductor component is formed of a substrate 5, which is heavily p-doped. Furthermore, a source electrode 6 that is in contact with the source zone 4 and also the base zone 3 is provided. A drain electrode 7 is in contact with the anode zone 2. A gate insulating layer 9 is disposed on the top side of the semiconductor component and the gate insulating layer 9 is situated between the source zone 4 and the anode zone 2. A gate electrode 8 and also a field plate 14 are situated on the gate insulating layer 9. Furthermore, a lateral insulation layer 10 is provided between the drain zone 1 and the substrate 5. The semiconductor component furthermore has, on its side, an insulation region 12 in the form of a trench. The insulation region 12 extends from the top side to as far as the lateral insulation layer 10. The LIGBT furthermore has p-type diffusion at the side of the trench insulation 12. The base zone 3, the source zone 4 and also the region situated under the gate electrode 8 are connected to a vertically running region 15 (p-type diffusion). The anode zone 2 and also the drain electrode 7 situated thereon are disposed in the center of the LIGBT. The LIGBT, shown in cross section in FIG. 1, generally has a finger-shaped form in plan view.

The method of operation of the LIGBT of FIG. 1 is explained below. If a voltage is applied to the gate electrode, then electrons pass from the source zone 4 into the drain zone 1. The lateral PNP transistor 2, 1, 3 is thus driven and, for its part, injects holes into the drain zone 1.

In order to switch the component off, the mobile charge carriers must be removed from the drain zone 1. This depletion operation becomes apparent by virtue of a current flow after the gate voltage has been switched off.

Figure 2:
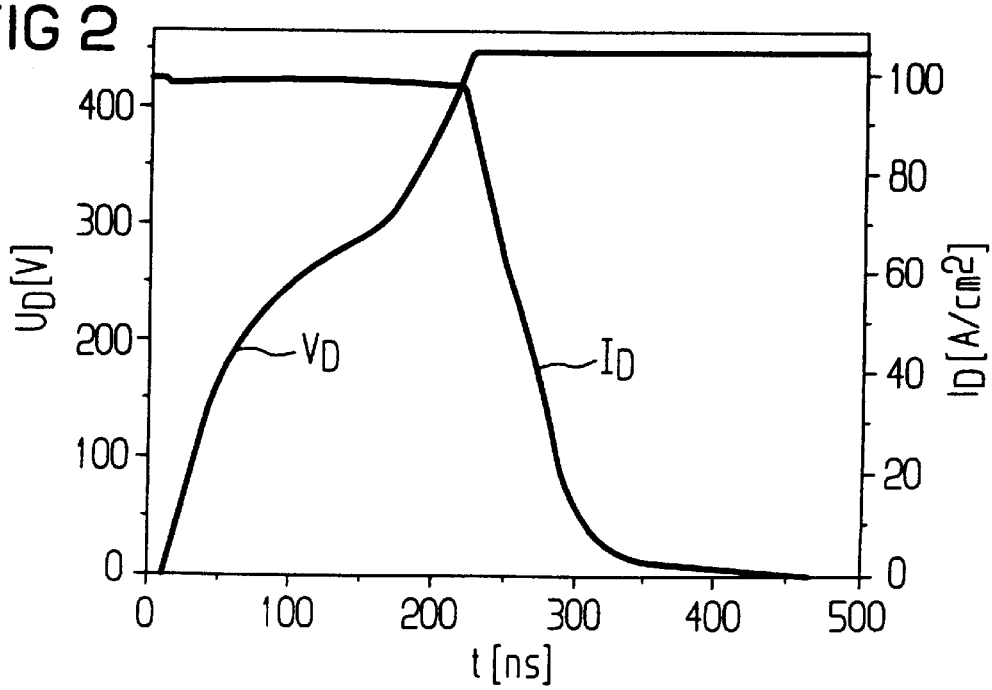
FIG. 2 is a graph showing a profile of drain voltage and drain current against time during a switching-off operation of the lateral IGBT, in principle.

FIG. 2 illustrates a typical profile of drain voltage and drain current against time during turn-off. What is characteristic of a component of this type is that, during the switching-off operation, the voltage across the component does not rise monotonically to its reverse voltage value but rather firstly rises rapidly to an average level, then continues for a time with a significantly lower rate of voltage rise, so that it then ultimately rises to the value of the reverse voltage. Not until the full reverse voltage is present across the semiconductor component can the current fall to 0. The terrace-shaped voltage rise is caused by the initially lateral depletion of the stored charge and then by the vertical depletion of the stored charge during the switching-off operation. The consequence of the terrace-shaped voltage profile is an unfavorable power loss balance of the LIGBT during turn-off.

A solution to this problem can be obtained by introducing a heavily doped p-diffused zone at the bottom of the dielectrically insulated well. The heavily doped p-diffused zone would consequently lie between the drain zone 1 and the lateral insulation layer 10 and be in contact with the vertically running p-doped region 15. An LIGBT having a p-diffused layer of this type is disclosed in Proceedings of 1997 International Symposium on Power Semiconductor Devices & ICs, pages 313–316. The consequence of introducing such a heavily doped p-diffused zone is that the terrace phase occurs at a significantly lower drain voltage and the power loss is thus significantly reduced. As is known, the power loss during the turn-off operation is calculated according to the formula $$P_{off} = 1 \cdot \int U \cdot dt$$

The disadvantage of this configuration, in comparison with that shown in FIG. 1, is that, given the same thickness of the drain zone 1, the blocking ability of the LIGBT is greatly reduced. The reduction in the blocking ability is caused by the fact that the electric field cannot penetrate the oxide insulation of the LIGBT subjected to reverse voltage loading because of the heavily doped layer at the bottom of the dielectrically insulated well.

Published, European Patent Application EP 0 338 312 A2 discloses an IGBT in which an oxide insulation layer in the form of a well is provided in the substrate. An anode region is provided within the oxide well, the anode region being disposed, proceeding from the surface, along the oxide well, and the anode region is perforated at the bottom of the oxide well. In that case, regions of the opposite conductivity type to that of the anode region are provided and form a further well on the side remote from the oxide insulation layer along the anode region. A high and uniform current flow is thereby obtained, the main current predominantly flowing in the vertical direction.

FIG. 3 shows the lateral IGBT according to the invention, in cross section. The IGBT has the drain zone 1 of the first conductivity type, which drain zone 1 extends to the top side.

The anode zone 2 of the second conductivity type is incorporated in the drain zone 1 and the anode zone 2 runs to the top side. Furthermore, the base zone 3 of the second conductivity type is incorporated in the drain zone 1 and the base zone 3 extends to the top side. There being incorporated in the base zone 3 the source zone 4 of the first conductivity type and the source zone 4 extends to the top side. The underside of the LIGBT forms the substrate 5 of the second conductivity type. The source electrode 6 is in contact with the source zone 4 and the base zone 3. The drain electrode 7 is in contact with the anode zone 2. The gate insulating layer 9 is disposed on the top side of the LIGBT and the gate insulating layer 9 is situated between the source zone 4 and the anode zone 2. The gate electrode 8 is disposed on the gate insulating layer 9. The lateral insulation layer 10 is provided between the drain zone 1 and the substrate 5. Furthermore, the LIGBT has the vertical insulation layer 12 in the form of a trench and the insulation layer 12 extends from the top side of the LIGBT to as far as the lateral insulation layer 10. The latter has the lowest potential of the semiconductor component; it is preferably at ground potential. The region of the second conductivity type 15 adjoins the insulation layer 12 in the form of a trench and is also connected to the base zone 3. The anode zone 2 lies in the drain extension 13 of the first conductivity type, which drain extension 13 adjoins the top side. The doping of the drain extension 13 is significantly higher than that of the drain zone 1. Furthermore, a field plate 14 covering the drain extension 13 is provided on the gate insulating layer 9.

The LIGBT furthermore has laterally formed regions 11 of the second conductivity type which are identically spaced apart from one another lying in one plane. The laterally formed regions 11 of the second conductivity type adjoin the lateral insulation layer 10. The consequence of this is that the laterally formed regions 11 are at the same potential as the lateral insulation layer 10.

It is also conceivable for the laterally formed regions 11 to be situated within the drain zone 1 such that they lie in one plane and are spaced apart from one another identically. However, it is necessary that the laterally formed regions 11 lie in the vicinity of the lateral insulation layer 10. The LIGBT has a structure that is mirror-symmetrical with respect to an axis I—I. Three lateral regions 11 of the second conductivity type that lie next to one another are illustrated in FIG. 3. Consequently, a total of six laterally formed regions 11 lie next to one another in one plane in the drain zone. However, it is also conceivable for more or fewer of the laterally formed regions 11 to be provided in the drain zone 1. In this case, it must only be ensured that the lateral insulation layer 10 is in contact with the drain zone 1 at some points. These interruptions are necessary in order to enable the electric field to penetrate the lateral insulation layer 10 in the event of the IGBT being subjected to reverse voltage loading, since otherwise the blocking ability of the component would be reduced. The laterally provided regions 11 contribute, on the other hand, to depleting the stored charge from the space charge zone more rapidly, during the turn-off of the L-IGBT, and, consequently, to reducing the switch-off losses.

Figure 4A:
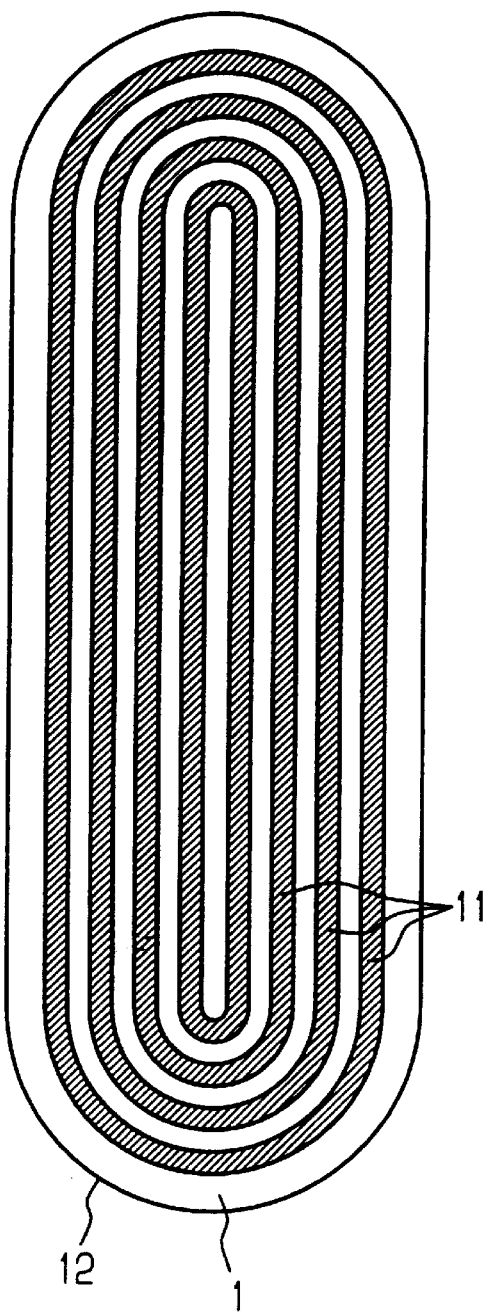
FIGS. 4a and 4b are plan view of exemplary embodiments of a configuration of laterally formed regions of a second conductivity type in a drain zone.
Figure 4B:
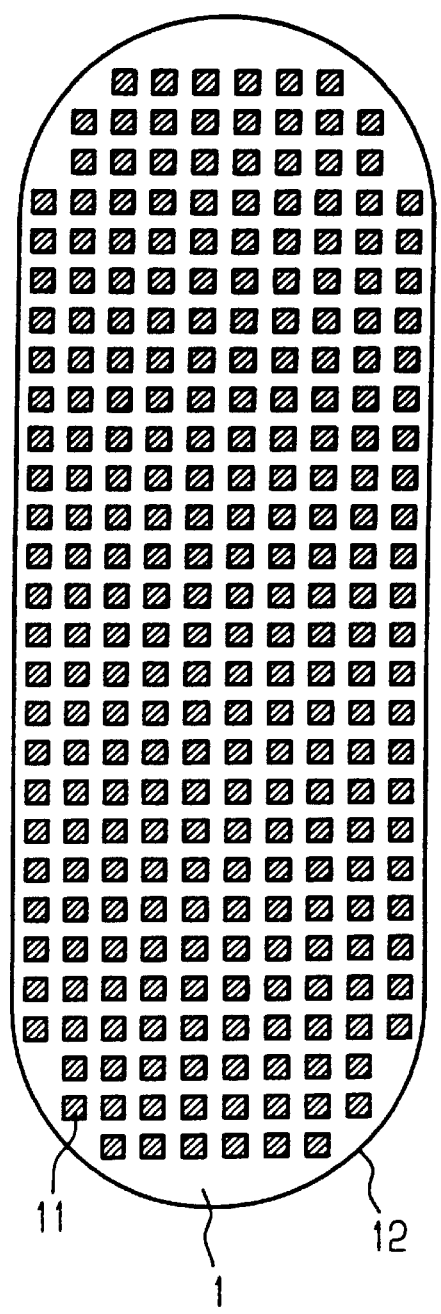

FIG. 4a and FIG. 4b show the lateral IGBT according to the invention in plan view in accordance with FIG. 3 along the line II—II. FIG. 4a shows the lateral regions 11 of the second conductivity type which are incorporated in the drain zone 1. In this case, the lateral regions 11 have a form that is adapted to the form of the LIGBT, that is to say they are finger-shaped. In FIG. 4a, four finger-shaped, laterally formed regions 11 are identically spaced apart from one another and lying in one plane. The mirror-symmetrical structure of the LIGBT emerges in this view.

FIG. 4b shows the lateral regions 11 lying in the drain zone 1. The laterally formed regions 11 have a rectangular form and are spaced apart from one another identically. The laterally formed regions 11 could also have a round, triangular or else polygonal form.

In both cases, the lateral regions 11 of the second conductivity type which are spaced apart from one another enable the electric field to penetrate the lateral insulation layer 10. The advantage of the configuration of the lateral regions 11 in accordance with FIG. 4b by comparison with FIG. 4a is that if the size of the individual laterally formed regions is considerably smaller than the lateral extent of the LIGBT, the lateral regions do not have to be aligned with the configuration of the base zone, the anode zone, etc. The pattern of laterally formed regions 11 can be applied over the entire surface as early as during the production of the wafer. The consequence of this is that the laterally formed regions 11 are also present on the underside, at locations where a logic circuit configuration is provided. They do not, however, have any effects on the logic circuit since the function thereof is principally determined by effects near the surface.

If the laterally formed regions 11 have a form adapted to the lateral extent of the IGBT, it must be ensured that the form is aligned with the regions disposed on the top side, since the requirement of a mirror-symmetrical structure must be fulfilled. This requirement increases the complexity in the course of fabricating the LIGBT according to the invention. FIG. 3 illustrates the LIGBT with an n-doped drain zone 1. The dopings of the other regions are specified in a corresponding form. However, it is also conceivable for the doping of the drain zone to be of the opposite conduction type, that is to say of the p-doped type. The remaining regions are doped correspondingly.

We claim:

1. A lateral insulated gate bipolar transistor (IGBT) in a silicon on insulator (SOI) configuration having a top side and an underside, comprising:
    a drain zone of a first conductivity type extending to the top side;
    an anode zone of a second conductivity type incorporated in said drain zone and extending to the top side;
    a base zone of the second conductivity type incorporated in said drain zone and extending to the top side;
    a source zone of the first conductivity type incorporated in said base zone and extending to the top side;
    a substrate of the second conductivity type forming the underside;
    a source electrode disposed in contact with said source zone and said base zone;
    a drain electrode disposed in contact with said anode zone;
    a gate insulating layer disposed on the top side between said source zone and said anode zone;
    a gate electrode disposed on said gate insulating layer;
    a lateral insulation layer disposed between said drain zone and said substrate; and
    at least one laterally formed region of the second conductivity type disposed in said drain zone in a vicinity of said lateral insulation layer.

2. The lateral IGBT according to claim 1, including an insulation region in a form of a trench, said insulation region extending from the top side to as far as said lateral insulating layer and forms a vertical extending boundary.

3. The lateral IGBT according to claim 1, including a drain extension of the first conductivity type adjoining the top side, said anode zone lying in said drain extension.

4. The lateral IGBT according to claim 3, including a field plate disposed on said gate insulating layer and covering said drain extension.

5. The lateral IGBT according to claim 1, wherein said substrate is at a fixed potential.

6. The lateral IGBT according to claim 2, including a vertically running region of the second conductivity type abutting said insulation region.

7. The lateral IGBT according to claim 2, wherein said insulation region is at a lowest potential.

8. The lateral IGBT according to claim 1, wherein said drain zone, said anode zone, said base zone, said source zone, said substrate, said source electrode, said drain electrode, said gate insulating layer, said gate electrode, said lateral insulation layer, and said at least one laterally formed region define an overall structure that is mirror-symmetrical in a lateral orientation.

9. The lateral IGBT according to claim 1, wherein said at least one laterally formed region is a plurality of laterally formed regions each having a polygonal form and are spaced apart at substantially equal distances from one another and lying in one plane.

10. The lateral IGBT according to claim 1, wherein said at least one laterally formed region is a plurality of laterally formed regions having a form adapted to a circumference, and are spaced apart at substantially equal distances from one another and lying in one plane.

11. The lateral IGBT according to claim 1, wherein said at least one laterally formed region is a plurality of laterally formed regions that adjoin said lateral insulation layer.

12. The lateral IGBT according to claim 6, wherein said at least one laterally formed region is a plurality of laterally formed regions and said drain zone has an edge, said laterally formed regions lying nearest said edge of said drain zone are in contact with said vertically running region of the second conductivity type.

13. The lateral IGBT according to claim 1, wherein said drain zone, said anode zone, said base zone, said source zone, said substrate, said source electrode, said drain electrode, said gate insulating layer, said gate electrode, said lateral insulation layer, and said at least one laterally formed region define an overall structure having a lateral form that is one of round shaped and finger shaped.

14. The lateral IGBT according to claim 1, wherein said lateral insulating layer is composed of $SiO_2$.

15. The lateral IGBT according to claim 2, wherein said insulating region is composed of $SiO_2$.

16. The lateral IGBT according to claim 1, wherein said at least one laterally formed region has a charge carrier density between $1*10^{17}$ and $1*10^{19}$.

* * * * *